(12) United States Patent
Kang et al.

(10) Patent No.: US 7,156,047 B2
(45) Date of Patent: Jan. 2, 2007

(54) APPARATUS FOR FABRICATING SEMICONDUCTOR DEVICE USING PLASMA

(75) Inventors: Sung-Woo Kang, Suwon-si (KR); Jong-Sun Hyun, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 117 days.

(21) Appl. No.: 11/112,317

(22) Filed: Apr. 22, 2005

(65) Prior Publication Data

US 2006/0011138 A1    Jan. 19, 2006

(30) Foreign Application Priority Data

Jul. 13, 2004    (KR) ...................... 10-2004-0054401

(51) Int. Cl.
*A01K 15/04* (2006.01)

(52) U.S. Cl. ................. 118/723 R; 118/723 I; 118/723 E; 315/111.21; 315/111.71

(58) Field of Classification Search ........................ 315/111.01–111.91; 118/723 R, 723 I, 723 E, 118/723 IR; 156/345
See application file for complete search history.

(56) References Cited

U.S. PATENT DOCUMENTS

| | | | |
|---|---|---|---|
| 6,841,943 B1 * | 1/2005 | Vahedi et al. ............ | 315/111.71 |
| 2002/0059981 A1 * | 5/2002 | Hao et al. ............... | 156/345.47 |
| 2003/0029567 A1 * | 2/2003 | Dhindsa et al. ......... | 156/345.47 |
| 2003/0037881 A1 * | 2/2003 | Barnes et al. ........... | 156/345.44 |
| 2003/0151371 A1 * | 8/2003 | Fischer et al. ........... | 315/111.21 |
| 2004/0000875 A1 * | 1/2004 | Vahedi et al. ............ | 315/111.71 |
| 2004/0020429 A1 * | 2/2004 | Jang ......................... | 118/715 |
| 2004/0118344 A1 * | 6/2004 | Ni et al. ................... | 118/723 E |
| 2004/0211517 A1 * | 10/2004 | Annapragada et al. . | 156/345.47 |
| 2004/0221958 A1 * | 11/2004 | Loewenhardt et al. . | 156/345.47 |
| 2005/0016568 A1 * | 1/2005 | Choe et al. ............... | 134/100.1 |

FOREIGN PATENT DOCUMENTS

KR    10-2004-0050080    6/2004

* cited by examiner

*Primary Examiner*—Tuyet Vo
*Assistant Examiner*—Tung Le
(74) *Attorney, Agent, or Firm*—F. Chau & Associates, LLC

(57) ABSTRACT

Provided is an apparatus for fabricating a semiconductor device using plasma, whereby a semiconductor device fabricating process using plasma provides significantly greater uniformity. The apparatus includes a process chamber, a first electrode through which a radio frequency (RF) power is supplied into the process chamber, a second electrode having a semiconductor substrate placed thereon, wherein the second electrode is disposed in the process chamber to face the first electrode and generates plasma used in fabricating a semiconductor device on the semiconductor substrate using the RF power, and a confinement ring assembly disposed between the first electrode and the second electrode, including a first confinement ring that moves in the vertical direction and a second confinement ring that surrounds the first confinement ring and moves in the vertical direction.

20 Claims, 8 Drawing Sheets

APPARATUS FOR FABRICATING SEMICONDUCTOR DEVICE USING PLASMA

CROSS-REFERENCE TO RELATED APPLICATION

This application claims priority under 35 U.S.C. §119 to Korean Patent Application No. 10-2004-0054401 filed on Jul. 13, 2004 in the Korean Intellectual Property Office, the disclosure of which is incorporated herein by reference.

BACKGROUND OF THE INVENTION

1. Field of the Invention

The present invention relates to an apparatus for fabricating a semiconductor device using plasma, and more particularly, to an apparatus for fabricating a semiconductor device using plasma, whereby the semiconductor device fabricating process using plasma provides significantly greater uniformity.

2. Description of the Related Art

Semiconductor devices such as dynamic random access memories (DRAM) and application specific integrated circuits (ASIC) generally comprise a plurality of electronic devices, for example, MOS transistors, capacitors, or resistors, which are formed on a semiconductor substrate. In recent years, due to the rapid development of the information communications industry and the wide use of information mediums such as computers, semiconductor devices require high speed operation as well as large-capacity storage capability. Thus, semiconductor device fabrication techniques for improving integration, reliability, and response speed of semiconductor devices have been developed.

When fabricating a semiconductor device, plasma may be used in the deposition process for forming a variety of layers on the surface of the semiconductor substrate or an etching process for forming a desired pattern. There are essentially two categories of etching processes: a wet etching process in which the portion to be etched is selectively removed by inducing a chemical reaction using a chemical solution; and a dry etching process in which the portion to be etched is removed using free electrons or ions of a reaction gas generated in a plasma state created by supplying radio frequency (RF) power. In particular, the dry etching process becomes more preferred as the semiconductor device becomes more highly integrated.

A conventional etching apparatus for fabricating a semiconductor device using plasma will now be described with reference to FIGS. 1 through 3. The apparatus shown in FIGS. 1 through 3 comprises a process chamber 11, a first electrode 12, a second electrode 16, and a confinement ring assembly 14. In the process chamber 11, an etching process is performed. To the first electrode 12 is transferred a radio frequency (RF) power from an RF power supply unit 18. A semiconductor substrate 15 is placed on the second electrode 16 and a reaction gas is supplied thereto from a gas supplying unit 17 to perform an etching process. As shown in FIG. 2, the confinement ring assembly 14 includes a first confinement ring 14_1, a second confinement ring 14_2, and a third confinement ring 14_3, which are connected to a confinement ring support unit 13. The first confinement ring 14_1, the second confinement ring 14_2, and the third confinement ring 14_3 are moved in a vertical direction, so that plasma pressure in the area where the semiconductor substrate 15 is placed can be adjusted.

Figure 1:
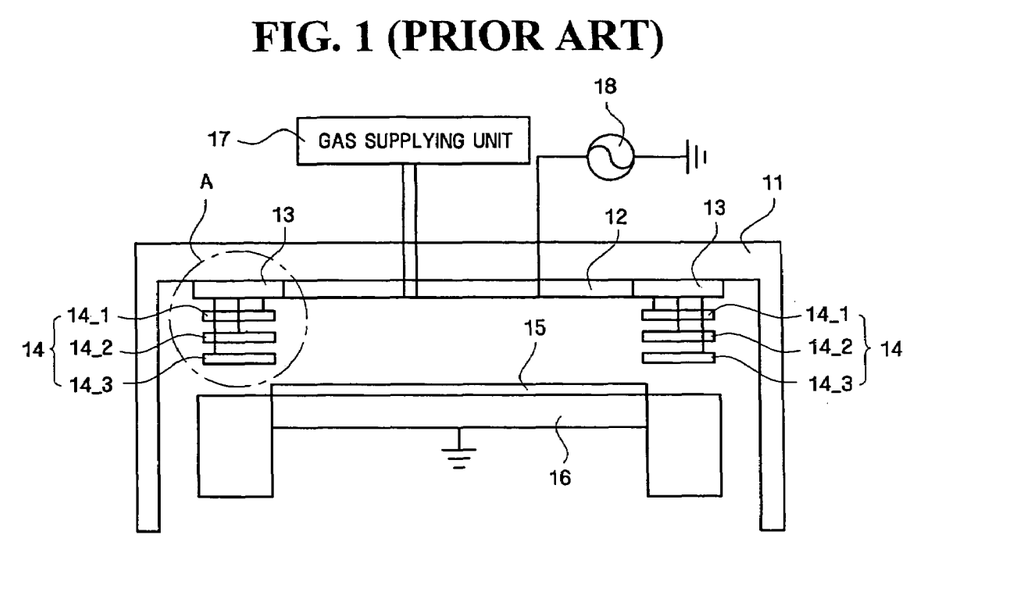
FIG. 1 is a schematic cross-sectional view of a conventional etching apparatus for fabricating a semiconductor device using plasma.
Figure 2:
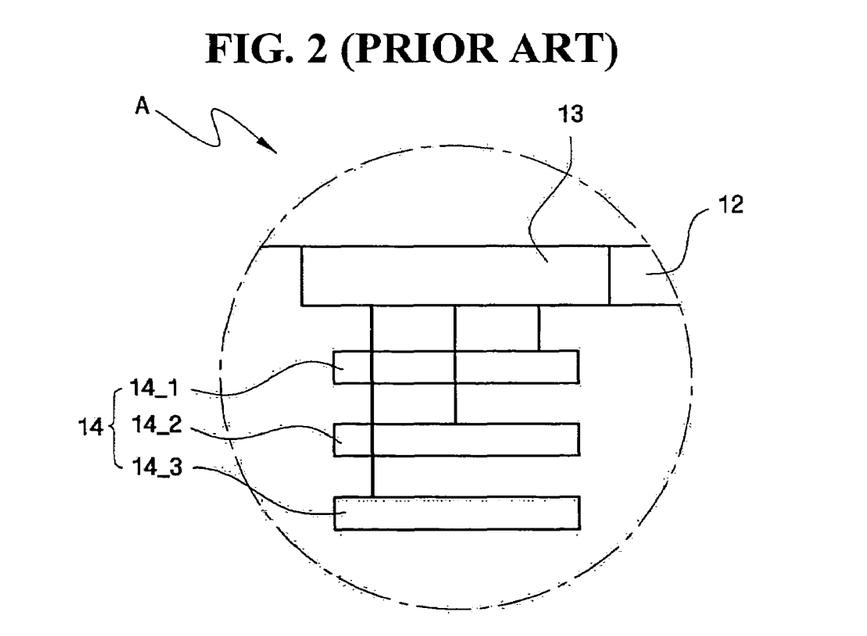
FIG. 2 is an enlarged cross-sectional view of confinement rings of the apparatus shown in FIG. 1.
Figure 3:
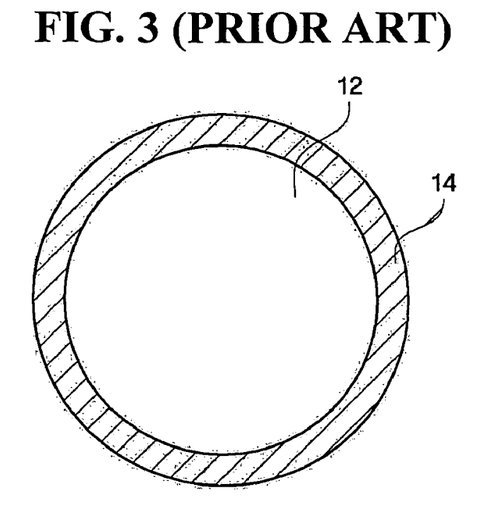
FIG. 3 is a plane view of confinement rings of the apparatus shown in FIG. 1.

FIG. 3 is a plane view of the confinement ring assembly 14 in a state where the confinement ring support unit 13 is removed from the apparatus of FIG. 1. As shown in FIG. 3, the confinement ring assembly 14 surrounds the first electrode 12. In other words, the first confinement ring 14_1, the second confinement ring 14_2, and the third confinement ring 14_3 surround the first electrode 12 and are separated from one another in the vertical direction.

The recent trend has been to increase the diameter of semiconductor substrates on which semiconductor devices are formed, thereby reducing the fabrication costs. For example, semiconductor devices have been fabricated using a silicon wafer having a diameter of 300 mm (12 inches) instead of a silicon wafer having a diameter of 200 mm (8 inches). As the diameter of semiconductor substrates increases, it is more difficult to ensure the uniformity of a semiconductor device fabricating process when fabricating semiconductor devices using the silicon wafer having the diameter of 300 mm compared to the case of fabricating semiconductor devices using the silicon wafer having the diameter of 200 mm. In particular, when etching a semiconductor substrate having a large diameter on which multiple layers are formed, i.e., when etching a semiconductor substrate having a large diameter on which multiple layers are formed using the conventional etching apparatus for fabricating a semiconductor device using plasma, it is very difficult to uniformly etch the lower part of a layer to be etched. Accordingly, uniformity in an etching process cannot be guaranteed.

SUMMARY OF THE INVENTION

The present invention provides an apparatus for fabricating a semiconductor device using plasma, which provides significantly greater uniformity in a semiconductor device fabricating process using plasma.

The present invention will become clear to those skilled in the art upon review of the following description, the attached drawings and appended claims.

According to one aspect of the present invention, there is provided an apparatus for fabricating a semiconductor device using plasma, the apparatus comprising a process chamber, a first electrode through which a radio frequency (RF) power is supplied into the process chamber, a second electrode having a semiconductor substrate placed thereon, wherein the second electrode is disposed in the process chamber to face the first electrode and generates plasma used in fabricating a semiconductor device on the semiconductor substrate using RF power, and a confinement ring assembly disposed between the first electrode and the second electrode, including a first confinement ring that moves in the vertical direction and a second confinement ring that surrounds the first confinement ring and moves in the vertical direction.

According to another aspect of the present invention, there is provided an apparatus for fabricating a semiconductor device using plasma, the apparatus comprising a process chamber, a first electrode through which a radio frequency (RF) power is supplied into the process chamber, a second electrode having a semiconductor substrate placed thereon, wherein the second electrode is disposed in the process chamber to face the first electrode and generates plasma used in fabricating the semiconductor device on the semiconductor substrate using RF power, and a confinement ring assembly including a first confinement ring group having a plurality of first confinement rings that are separated from one another in a vertical direction between the first electrode and the second electrode and moves in the vertical direction and a second confinement ring group having a plurality of second confinement rings that surround the plurality of first confinement rings, are separated from one another in the vertical direction and moves in the vertical direction.

In yet another aspect of the present invention, there is provided an apparatus for fabricating a semiconductor device using plasma, the apparatus comprising a process chamber, a first electrode through which a radio frequency (RF) power is supplied into the process chamber, a second electrode having a semiconductor substrate placed thereon, wherein the second electrode is disposed in the process chamber to face the first electrode and generates plasma used in fabricating the semiconductor device on the semiconductor substrate using RF power, and a confinement ring assembly comprising a plurality of confinement ring groups, wherein each of the confinement ring groups are spaced horizontally and disposed along the first electrode and facing the second electrode, each of the confinement ring group having a plurality of first confinement rings that are separated from one another in a vertical direction between the first electrode and the second electrode and moves in the vertical direction.

BRIEF DESCRIPTION OF THE DRAWINGS

The present invention will become more apparent by describing in detail an exemplary embodiment thereof with reference to the attached drawings in which.

DETAILED DESCRIPTION OF THE PREFERRED EMBODIMENTS

Features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

An apparatus for fabricating a semiconductor device using plasma according to embodiments of the present invention comprises a confinement ring assembly having a first confinement ring that can move in a vertical direction and a second confinement ring that surrounds the first confinement ring and can move in the vertical direction. Thus, the confinement ring assembly moves each of the first confinement ring and the second confinement ring in the vertical direction such that plasma pressure in an area in which a semiconductor substrate is placed can be adjusted both in the vertical direction and a horizontal direction. Thus, plasma pressure in the area in which the semiconductor substrate is placed can be more finely adjusted.

An etching apparatus for fabricating a semiconductor device using plasma according to an embodiment of the present invention will now be described with reference to FIGS. 4 through 6.

Figure 4:
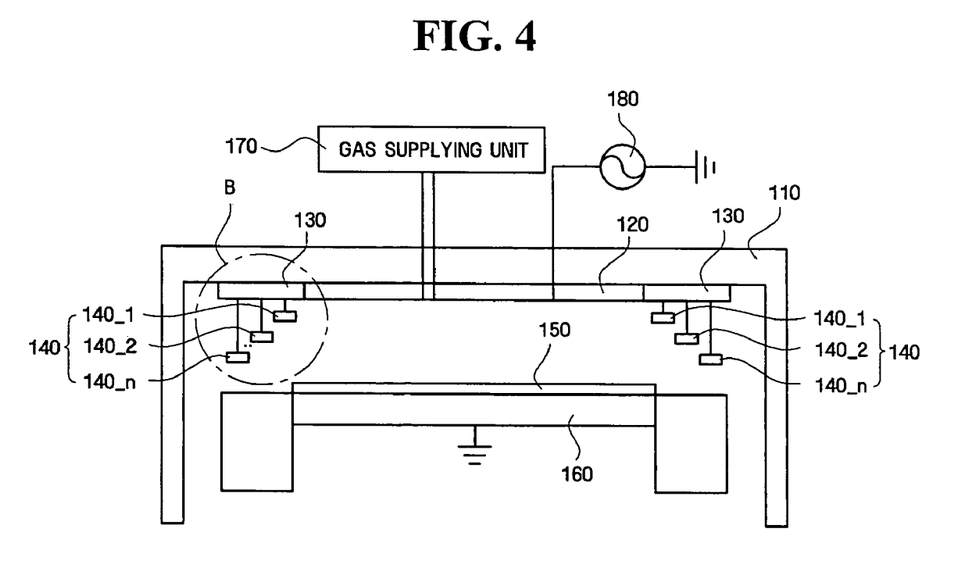
FIG. 4 is a schematic cross-sectional view of an etching apparatus for fabricating a semiconductor device using plasma according to an embodiment of the present invention.
Figure 5A:
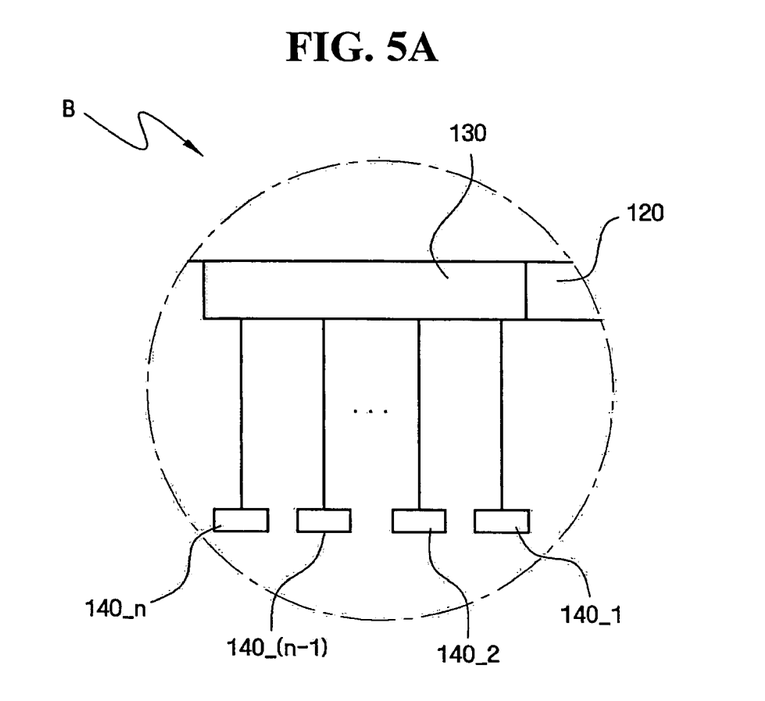
FIGS. 5A through 5E are enlarged cross-sectional views illustrating the case where confinement rings of the apparatus shown in FIG. 4 are in various positions.
Figure 5B:
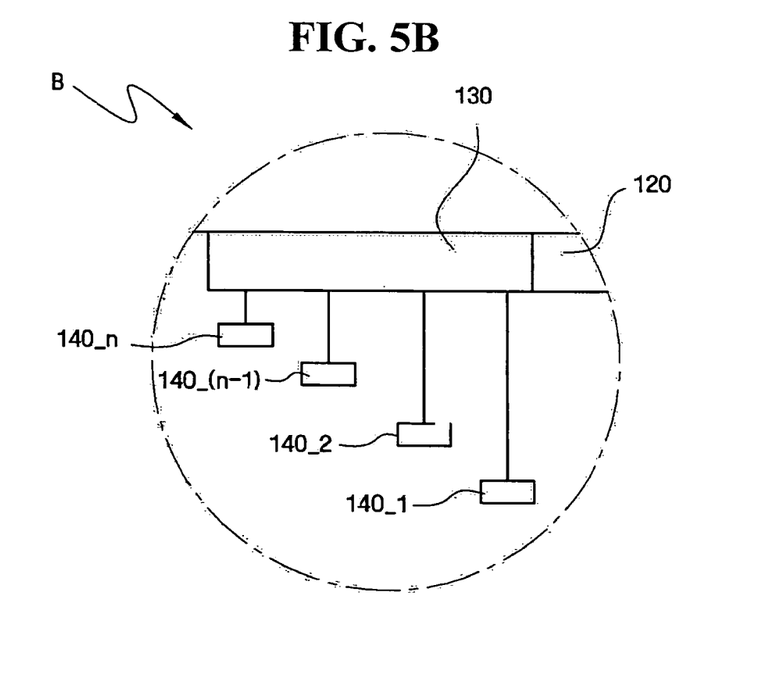
Figure 5C:
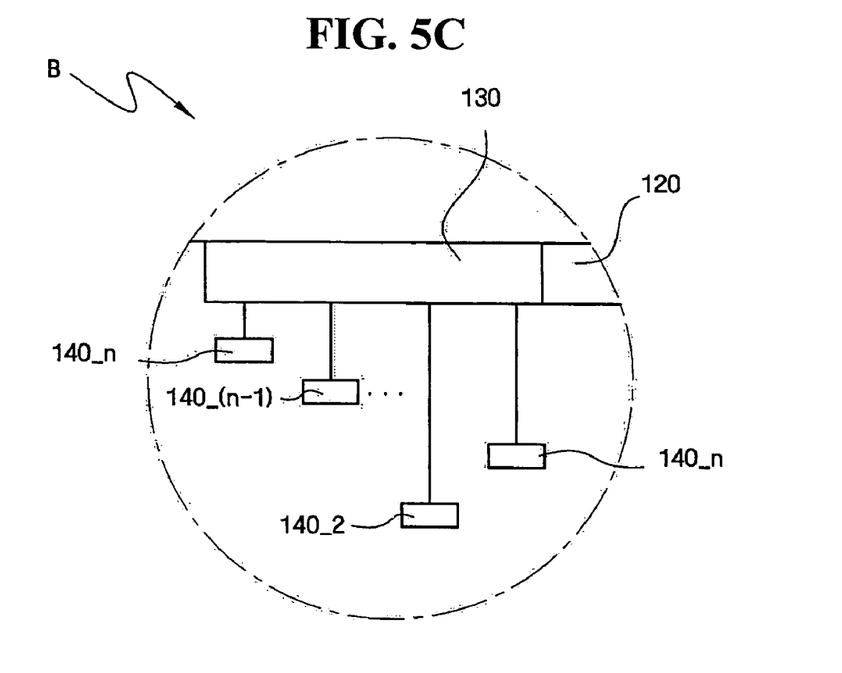
Figure 5D:
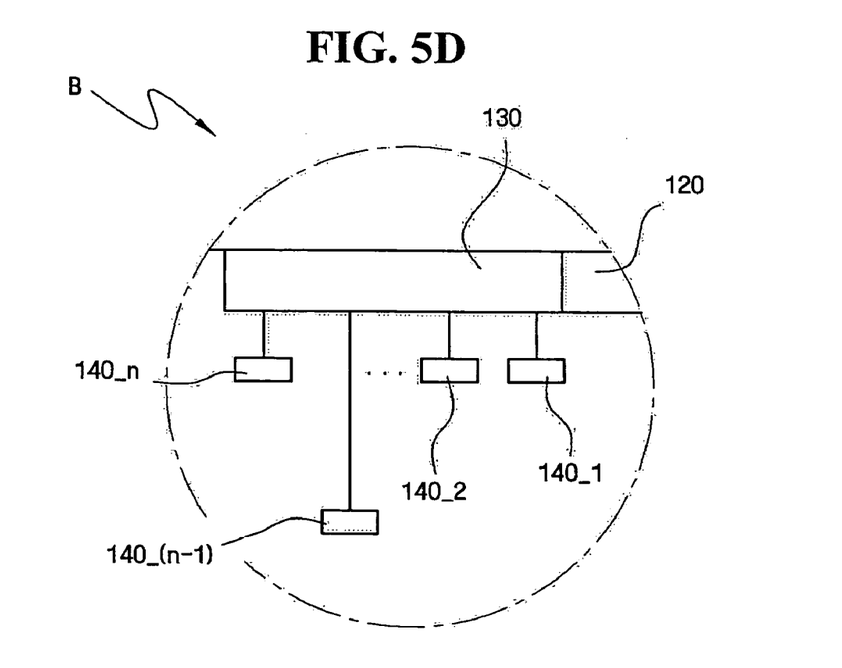
Figure 5E:
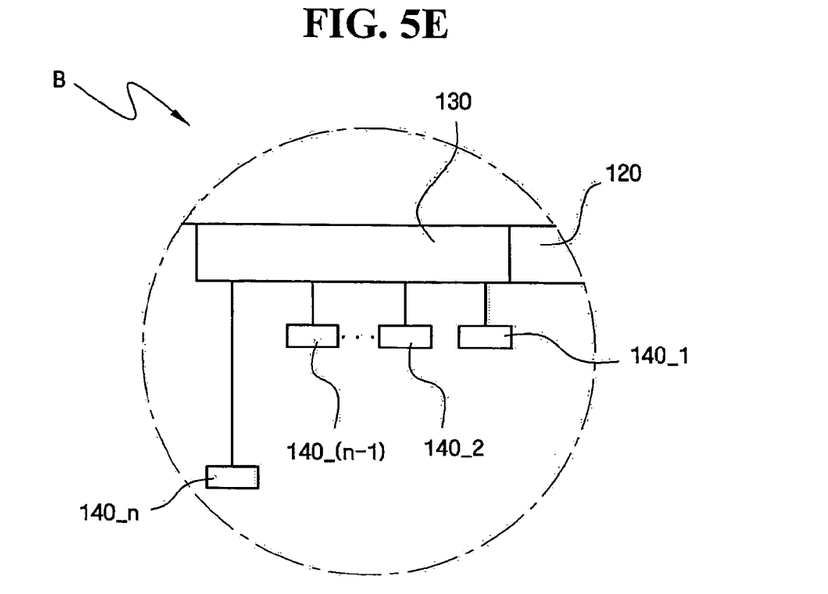
Figure 6:
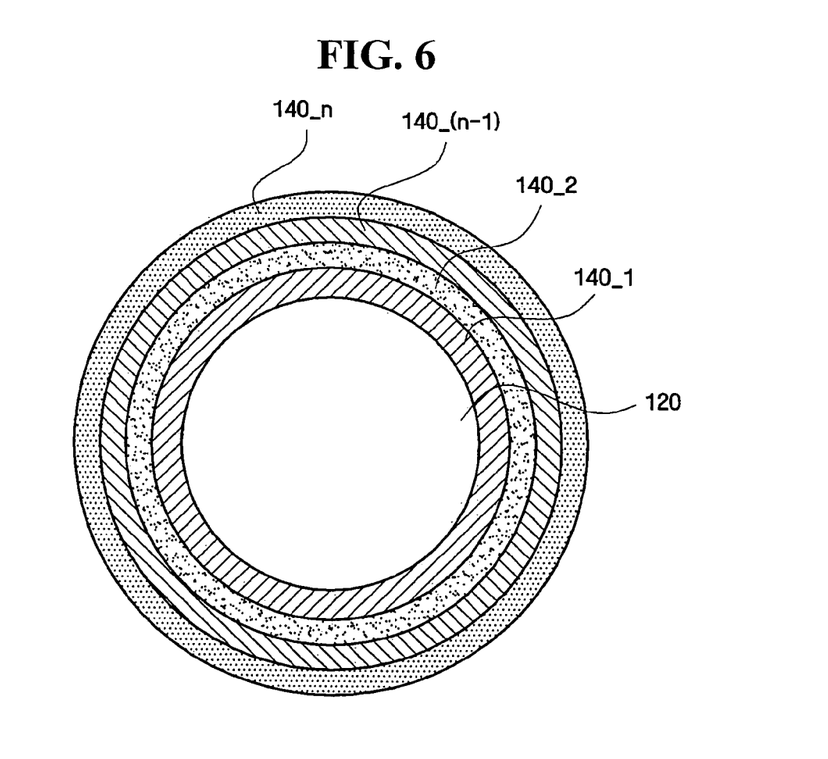
FIG. 6 is a plane view of confinement rings of the apparatus shown in FIG. 4.
Figure 7A:
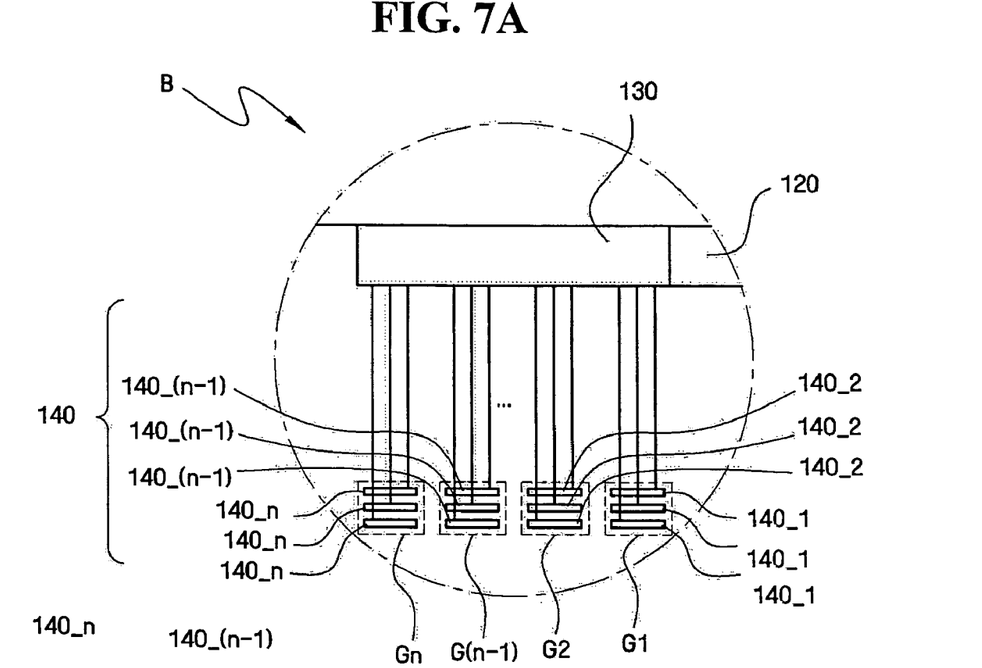
FIGS. 7A through 7E are enlarged cross-sectional views illustrating the case where confinement ring groups of an etching apparatus for fabricating a semiconductor device using plasma according to another embodiment of the present invention are in various positions.
Figure 7B:
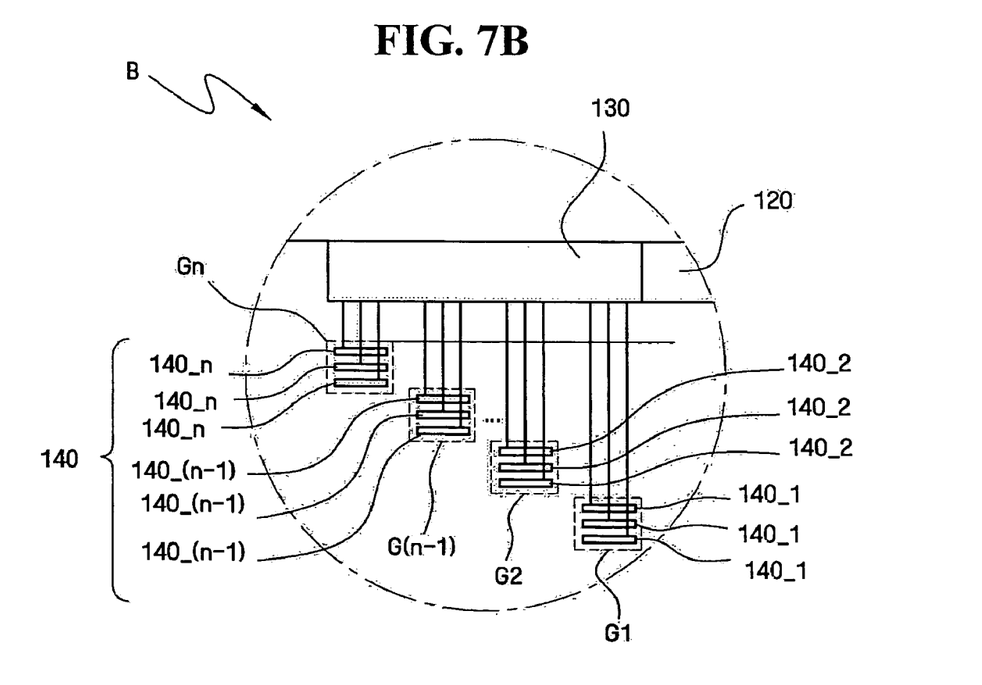
Figure 7C:
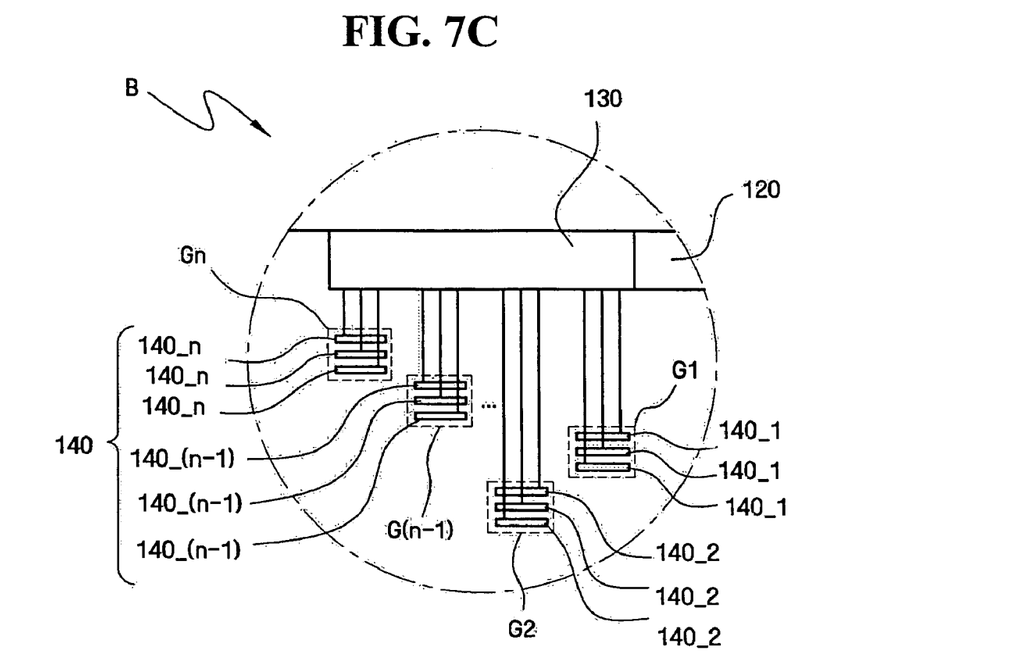
Figure 7D:
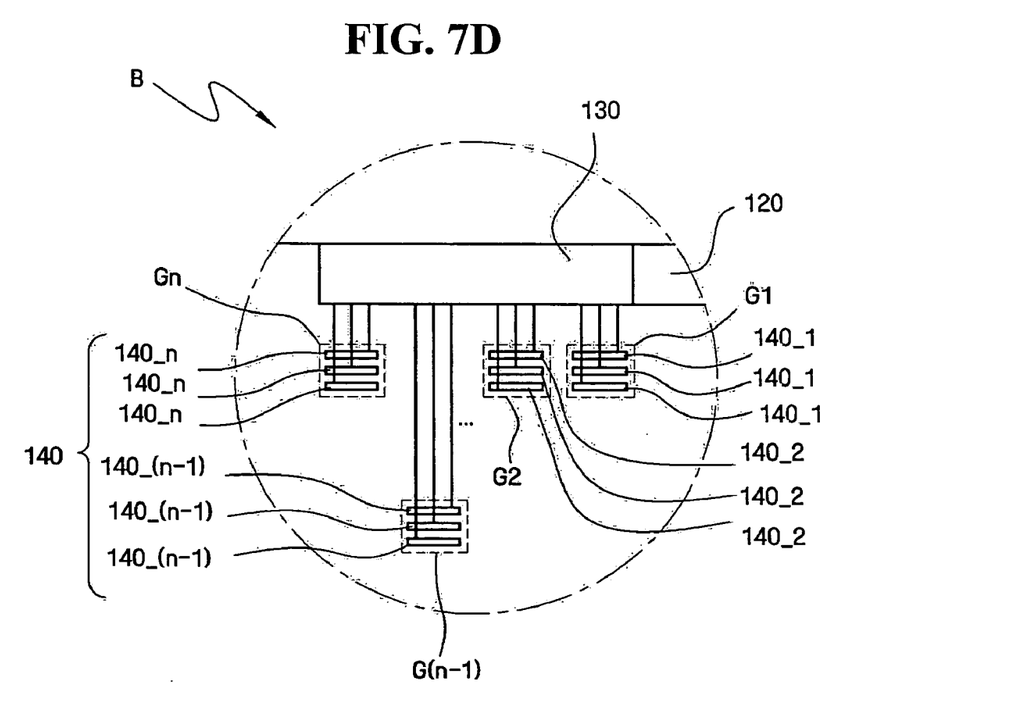
Figure 7E:
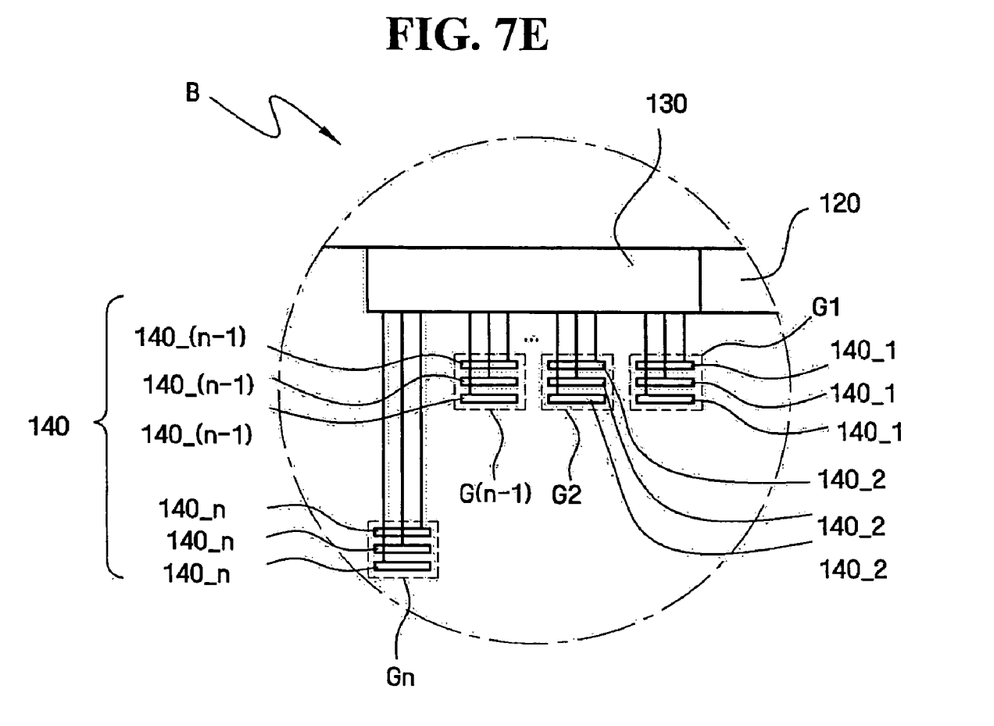

FIG. 4 is a schematic cross-sectional view of an etching apparatus for fabricating a semiconductor device using plasma according to an embodiment of the present invention, FIGS. 5A through 5E are enlarged cross-sectional views illustrating cases where confinement rings of the etching apparatus for fabricating a semiconductor device using plasma according to an embodiment of the present invention are vertically moved to various positions with respect to the semiconductor substrate, and FIG. 6 is a plane view of confinement rings in the case where a confinement ring support unit is removed from the apparatus shown in FIG. 4.

As shown in FIG. 4, the etching apparatus for fabricating a semiconductor device using plasma according to an embodiment of the present invention comprises a process chamber 110, a first electrode 120, a second electrode 160, and a confinement ring assembly 140.

An etching process used to form a semiconductor device on a semiconductor substrate 150 is performed in the process chamber 110. Radio frequency (RF) power is transferred to the first electrode 120 from the RF power supply unit 180 and is supplied into the process chamber 110. The semiconductor substrate 150 is placed on the second electrode 160 using static electricity, and a ground voltage is connected to the second electrode 160. Then, the etching process is performed on the semiconductor substrate 150 using free electrons or ions of a reaction gas, which are generated when a plasma state is formed by applying RF power to the reaction gas. The reaction gas is supplied by a gas supplying unit 170 between the first electrode 120 and the second electrode 160.

As shown in FIGS. 5A through 5E and 6, the confinement ring assembly 140 is disposed between the first electrode 120 and the second electrode 160 and is formed in such manner that a first confinement ring 140_1 and a second confinement ring 140_2 are connected to a confinement ring support unit 130. The first confinement ring 140_1 surrounds the first electrode 120 and can move in the vertical direction. The second confinement ring 140_2 surrounds the first confinement ring 140_1 and can move in the vertical direction. The confinement ring assembly 140 surrounds a space between the first electrode 120 and the second electrode 160 so that plasma discharge can be confined in an area in which the semiconductor substrate 150 is placed. The space in which the confinement ring assembly 140 is formed is adjusted so that particles (for example, free electronics or ions of a reaction gas) charged by plasma can be neutralized.

In addition, since the moving length taken for the charged particles to escape outside the first confinement ring 140_1 and the second confinement ring 140_2 is substantially longer than the length of a mean free path, the escaping particles are likely to collide with the first confinement ring 140_1 or the second confinement ring 140_2 at least once.

Owing to these collisions, the charges of the particles are neutralized, and thus, the discharged particles become neutral. Thus, the confinement ring assembly 140 can effectively prevent plasma discharge from occurring outside the space formed by the first confinement ring 140_1 and the second confinement ring 140_2. Thus, the first confinement ring 140_1 and the second confinement ring 140_2 are moved in the vertical direction so that plasma pressure in the area in which the semiconductor substrate 150 is placed can be adjusted.

The etching apparatus for fabricating a semiconductor device using plasma according to an embodiment of the present invention comprises a second confinement ring 140_2 that surrounds the first confinement ring 140_1. The first confinement ring 140_1 and the second confinement ring 140_2 can move in the vertical direction, respectively.

Thus, as shown in FIG. 5A, both the first confinement ring 140_1 and the second confinement ring 140_2 can be made closest to the semiconductor substrate 150.

Alternatively, as shown in FIG. 5B, the first confinement ring 140_1 can be the closest to the semiconductor substrate 150, and the second confinement ring 140_2 can be further away from the semiconductor substrate 150 than the first confinement ring 140_1.

Alternatively, as shown in FIG. 5C, the second confinement ring 140_2 can be the closest to the semiconductor substrate 150, and the first confinement ring 140_1 can be further away from the semiconductor substrate 150 than the second confinement ring 140_2.

Alternatively, as shown in FIG. 5D, the first confinement ring 140_1 and the second confinement ring 140_2 can be made farthest away from the semiconductor substrate 150.

As such, plasma pressure in the area in which the semiconductor substrate 150 is placed can be adjusted both in the vertical direction and the horizontal direction.

Using the confinement ring assembly 140 described above, plasma pressure in the area in which the semiconductor substrate 150 is placed can be more finely adjusted. Thus, even when a semiconductor substrate (for example, a silicon wafer having a diameter of 300 mm) having a large diameter on which multiple layers are formed is etched, the lower part of a layer to be etched can be uniformly etched such that the etching process provides significantly greater uniformity.

Preferably, the first confinement ring 140_1 and the second confinement ring 140_2 are separated from each other. As such, when the first confinement ring 140_1 and the second confinement ring 140_2 move in the vertical direction, contaminants that may be generated when the first confinement ring 140_1 and the second confinement ring 140_2 are in contact with each other, can be effectively prevented.

The first confinement ring 140_1 and the second confinement ring 140_2 are made of a dielectric material. Thus, plasma discharge can be confined to the space within the confinement ring assembly 140, without affecting the density of plasma formed by the RF power. Preferably, the dielectric material is silica or quartz. When such materials are used, the first confinement ring 140_1 and the second confinement ring 140_2 become very stable against collision of the charged particles.

The confinement ring assembly 140 may further comprise third through n-th (n≧3) confinement rings 140_n that are disposed between the first electrode 120 and the second electrode 160 so as to surround the second confinement ring 140_2 and can move in the vertical direction.

Thus, as shown in FIGS. 5A through 5E, each of the third through n-th confinement rings 140_n can be close to or far from the semiconductor substrate 150. As such, the confinement ring assembly 140 can more finely adjust plasma pressure in the area in which the semiconductor substrate 150 is placed, in the horizontal direction. Preferably, n is equal to or greater than 3. Thus, plasma pressure in the area in which the semiconductor substrate 150 is placed can be sufficiently adjusted in the horizontal direction.

As described above, preferably, the n-th confinement ring 140_n is separated from an (n−1)-th confinement ring 140_(n−1). Preferably, the n-th confinement ring 140_n is made of a dielectric material such as silica or quartz.

An etching apparatus for fabricating a semiconductor device using plasma according to another embodiment of the present invention will now be described with reference to FIG. 7.

FIGS. 7A through 7E are enlarged cross-sectional views illustrating a case where confinement ring groups of the etching apparatus for fabricating a semiconductor device using plasma according to another embodiment of the present invention are in various positions.

The etching apparatus for fabricating a semiconductor device using plasma according to this embodiment of the present invention comprises a process chamber 110, a first electrode 120, a second electrode 160, and a confinement ring assembly 140.

Descriptions of the same elements of the etching apparatus for fabricating a semiconductor device using plasma according to another embodiment of the present invention as those of the apparatus for fabricating a semiconductor device using plasma according to an embodiment of the present invention will be omitted, and only differences therebetween will be described.

As shown in FIGS. 7A through 7E, the confinement ring assembly 140 is formed in such a manner that a first confinement ring group G1 and a second confinement ring group G2 are connected to a confinement ring support unit 130. The first confinement ring group G1 comprises a plurality of first confinement rings 140_1. The plurality of first confinement rings 140_1 are separated from one another in the vertical direction, and each of the first confinement rings 140_1 can move in the vertical direction. In addition, the second confinement ring group G2 comprises a plurality of second confinement rings 140_2 that surround the first confinement rings 140_1. The second confinement rings 140_2 are separated from one another in the vertical direction, and each of the second confinement rings 140_2 can move in the vertical direction.

The confinement ring assembly 140 of the etching apparatus for fabricating a semiconductor device using plasma according to this embodiment of the present invention comprises the first confinement ring group G1 having the plurality of first confinement rings 140_1 and the second confinement ring group G2 having the plurality of second confinement rings 140_2. The first confinement rings 140_1 and the second confinement rings 140_2 can move in the vertical direction.

Thus, the first confinement rings 140_1 are far from or close to the semiconductor substrate 150 and the second confinement rings 140_2 are close to or far from the semiconductor substrate 150 such that plasma pressure in the area in which the semiconductor substrate 150 is placed is adjusted both in the vertical direction and the horizontal direction.

Consequently, plasma pressure in the area in which the semiconductor substrate 150 is placed can be more finely adjusted. Thus, even when a semiconductor substrate (for example, silicon wafer having the diameter of 300 mm) having a large diameter on which multiple layers are formed is etched, the lower part of a layer to be etched can be more uniformly etched such that the etching process provides significantly greater uniformity.

Preferably, the first confinement rings 140_1 and the second confinement rings 140_2 are separated from one another as described above, and are made of a dielectric material such as silica or quartz.

Preferably, the number of first confinement rings 140_1 is the same as that of the second confinement rings 140_2. As such, plasma pressure in the area in which the semiconductor substrate 150 is placed can be uniformly adjusted in the vertical direction.

Preferably, the number of first confinement rings 140_1 and the number of second confinement rings 140_2 are equal to or greater than 3. As such, plasma pressure in the area in which the semiconductor substrate 150 is placed can be sufficiently adjusted in the vertical direction.

Preferably, the confinement ring assembly 140 of the etching apparatus for fabricating a semiconductor device using plasma according to another embodiment of the present invention further comprises an n-th confinement ring group Gn having a plurality of n-th ($(n \geq 3)$) confinement rings 140_n between the first electrode 120 and the second electrode 160.

Here, the plurality of n-th ($n \geq 3$) confinement rings 140_n surround a plurality of (n−1)-th confinement rings 140_(n−1), and each of the plurality of n-th ($n \geq 3$) confinement rings 140_n can move in the vertical direction.

Thus, each of the plurality of n-th confinement rings 140_n is close to or far from the semiconductor substrate 150 such that plasma pressure in the area in which the semiconductor substrate 150 is placed is more finely adjusted in the horizontal direction. Preferably, n is equal to or greater than 3, as described above.

Preferably, the plurality of n-th confinement rings 140_n and the plurality of (n−1)-th confinement rings 140_(n−1) are separated from one another as described above, and are made of a dielectric material such as silica or quartz. In addition, the number of n-th confinement rings 140_n is the same as that of the plurality of (n−1)-th confinement rings 140_(n−1). Preferably, the number of (n−1)-th confinement rings 140_(n−1) and the number of n-th confinement rings 140_n are equal to or greater than 3.

The embodiments of the present invention describe the etching apparatus for fabricating a semiconductor device using plasma but the technical spirit of the present invention is not limited to the etching apparatus for fabricating a semiconductor device using plasma and can be implemented in other apparatuses for fabricating a semiconductor device using plasma. For example, the present invention can be applied to a sputtering apparatus, a PVD apparatus, or a PE CVD apparatus or the like.

Those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

As described above, in the apparatus for fabricating a semiconductor device using plasma according to the present invention, the first confinement ring and the second confinement ring that surrounds the first confinement ring, respectively, are moved in the vertical direction such that plasma pressure in the semiconductor substrate area can be adjusted both in the vertical direction and the horizontal direction.

Accordingly, the apparatus for fabricating a semiconductor device using plasma according to the present invention can more finely adjust plasma pressure in the area in which the semiconductor substrate is placed such that the semiconductor device fabricating process using plasma provide significantly greater uniformity.

What is claimed is:

1. An apparatus for fabricating a semiconductor device using plasma, the apparatus comprising:
    a process chamber;
    a first electrode through which a radio frequency (RF) power is supplied into the process chamber;
    a second electrode having a semiconductor substrate placed thereon, wherein the second electrode is disposed in the process chamber to face the first electrode and generates plasma used in fabricating the semiconductor device on the semiconductor substrate using the RF power; and
    a confinement ring assembly disposed between the first electrode and the second electrode, including a first confinement ring that moves in the vertical direction and a second confinement ring that surrounds the first confinement ring and moves in the vertical direction.

2. The apparatus of claim 1, wherein the second confinement ring is separated from the first confinement ring.

3. The apparatus of claim 1, wherein the first confinement ring and the second confinement ring are made of a dielectric material.

4. The apparatus of claim 3, wherein the first confinement ring and the second confinement ring are made of silica or quartz.

5. The apparatus of claim 1, wherein the confinement ring assembly further comprises a third through n-th ($n \geq 3$) confinement rings surrounding the second confinement ring.

6. The apparatus of claim 5, wherein the third confinement ring is separated from the second confinement ring, and the n-th confinement ring is separated from a (n−1)-th confinement ring.

7. An apparatus for fabricating a semiconductor device using plasma, the apparatus comprising:
    a process chamber;
    a first electrode through which a radio frequency (RF) power is supplied into the process chamber;
    a second electrode having a semiconductor substrate placed thereon, wherein the second electrode is disposed in the process chamber to face the first electrode and generates plasma used in fabricating the semiconductor device on the semiconductor substrate using the RF power; and
    a confinement ring assembly including a first confinement ring group having a plurality of first confinement rings that are separated from one another in a vertical direction between the first electrode and the second electrode and moves in the vertical direction and a second confinement ring group having a plurality of second confinement rings that surround the plurality of first confinement rings, are separated from one another in the vertical direction and moves in the vertical direction.

8. The apparatus of claim 7, wherein the plurality of second confinement rings are separated from the plurality of first confinement rings.

9. The apparatus of claim 7, wherein the plurality of first confinement rings and the plurality of second confinement rings are made of a dielectric material.

10. The apparatus of claim 9, wherein the plurality of first confinement rings and the plurality of second confinement rings are made of silica or quartz.

11. The apparatus of claim 7, wherein the confinement ring assembly comprises three or more first confinement rings and second confinement rings, respectively.

12. The apparatus of claim 11, wherein the number of second confinement rings is the same as the number of first confinement rings.

13. The apparatus of claim 7, wherein the confinement ring assembly further comprises a third through n-th ($n \geq 3$) confinement ring groups respectively consisting of a third through n-th ($n \geq 3$) confinement rings, which are arranged surrounding the plurality of the second confinement rings.

14. The apparatus of claim 13, wherein the third confinement rings are separated from the second confinement rings, and the n-th confinement rings are separated from a (n−1)-th confinement rings.

15. The apparatus of claim 13, wherein the number of the n-th confinement rings is the same as the number of the (n−1)-th confinement rings.

16. An apparatus for fabricating a semiconductor device using plasma, the apparatus comprising:
  a process chamber;
  a first electrode through which a radio frequency (RF) power is supplied into the process chamber;
  a second electrode having a semiconductor substrate placed thereon, wherein the second electrode is disposed in the process chamber to face the first electrode and generates plasma used in fabricating the semiconductor device on the semiconductor substrate using RF power; and
  a confinement ring assembly comprising a plurality of confinement ring groups, wherein each of the confinement ring groups are spaced horizontally and disposed along the first electrode and facing the second electrode, each of the confinement ring group having a plurality of confinement rings that are separated from one another in a vertical direction between the first electrode and the second electrode and moves in the vertical direction.

17. The apparatus of claim 16, wherein each of the confinement ring group comprises three or more confinement rings.

18. The apparatus of claim 17, wherein the confinement ring assembly comprises the same number of confinement rings with the other confinement ring groups.

19. The apparatus of claim 17, wherein the confinement ring assembly comprises a third through n-th ($n \geq 3$) confinement ring groups respectively consisting of a third through n-th ($n \geq 3$) confinement rings, which are arranged surrounding the plurality of the second confinement rings.

20. The apparatus of claim 19, wherein the third confinement rings are separated from the second confinement rings, and the n-th confinement rings are separated from a (n−1)-th confinement rings.

* * * * *